(12) United States Patent
Chang et al.

(10) Patent No.: US 8,008,897 B2
(45) Date of Patent: *Aug. 30, 2011

(54) BOOST CONVERTER WITH INTEGRATED HIGH POWER DISCRETE FET AND LOW VOLTAGE CONTROLLER

(75) Inventors: Allen Chang, Fremont, CA (US); Wai-Keung Peter Cheng, Union City, CA (US)

(73) Assignee: Alpha & Omega Semiconductor, Ltd, Hamilton (BM)

( * ) Notice: Subject to any disclaimer, the term of this patent is extended or adjusted under 35 U.S.C. 154(b) by 585 days.

This patent is subject to a terminal disclaimer.

(21) Appl. No.: 11/761,301

(22) Filed: Jun. 11, 2007

(65) Prior Publication Data

US 2008/0304305 A1    Dec. 11, 2008

(51) Int. Cl.
*G05F 1/10* (2006.01)
*H01L 25/04* (2006.01)

(52) U.S. Cl. ......................... 323/222; 257/777

(58) Field of Classification Search .................. 323/220, 323/222, 282, 283, 351; 257/676, 777
See application file for complete search history.

(56) References Cited

U.S. PATENT DOCUMENTS

| | | | | |
|---|---|---|---|---|
| 4,344,081 A | 8/1982 | Pao et al. | | 257/378 |
| 5,126,807 A | 6/1992 | Baba et al. | | 257/401 |
| 5,242,845 A | 9/1993 | Baba et al. | | 438/243 |
| 5,260,227 A | 11/1993 | Farb et al. | | 438/192 |
| 5,578,508 A | 11/1996 | Baba et al. | | 438/270 |
| 5,965,947 A * | 10/1999 | Nam et al. | | 257/783 |
| 5,998,833 A | 12/1999 | Baliga | | 257/329 |
| 6,621,121 B2 | 9/2003 | Baliga | | 257/330 |
| 6,699,775 B2 | 3/2004 | Bol et al. | | |
| 6,975,023 B2 * | 12/2005 | Oliver et al. | | 257/676 |
| 7,195,952 B2 * | 3/2007 | Vinn et al. | | 438/108 |
| 7,436,070 B2 | 10/2008 | Uno et al. | | |
| 7,443,648 B2 * | 10/2008 | Cutter et al. | | 361/139 |
| 7,750,447 B2 * | 7/2010 | Chang et al. | | 257/676 |
| 2004/0169262 A1 | 9/2004 | Oliver et al. | | |
| 2006/0073023 A1 | 4/2006 | Ghoshal et al. | | |
| 2008/0024102 A1 * | 1/2008 | Hebert et al. | | 323/282 |
| 2008/0035987 A1 | 2/2008 | Hebert | | |
| 2008/0067584 A1 | 3/2008 | Lui | | |
| 2008/0304306 A1 | 12/2008 | Chang et al. | | |

FOREIGN PATENT DOCUMENTS

CN    1691327 A    11/2005
WO    2006020921 A2    2/2006

OTHER PUBLICATIONS

U.S. Appl. No. 11/522,669 entitled "Inverted-Trench Grounded-Source FET Structure With Trenched Source-Body Short Electrode" to Sik K. Lui et al., filed Sep. 16, 2006.
U.S. Appl. No. 11/761,313 entitled "High Voltage and High Power Boost Converter With Co-Packaged Schottky Diode" to Allen Chang et al., filed Jun. 11, 2007.

(Continued)

*Primary Examiner* — Adolf Berhane
(74) *Attorney, Agent, or Firm* — Joshua D. Isenberg; JDI Patent (57) ABSTRACT

A boost converter for high power and high output voltage applications includes a low voltage controller integrated circuit and a high voltage, vertical, discrete field effect transistor, both of which are packed in a single package.

24 Claims, 12 Drawing Sheets

OTHER PUBLICATIONS

U.S. Appl. No. 11/500,810 entitled "Inverted-Trench Grounded-Source FET Structure Using Conductive Substrates, With Highly Doped Substrates" to Francois Hebert et al, filed Aug. 7, 2006.
Chinese Office Action dated Nov. 27, 2009 issued for Chinese patent application No. 2008101098622.U.S.
U.S. Appl. No. 12/784,391, filed May 20, 2010.
Notice of Allowance and Fee(s) Due dated Feb. 22, 2010 issued for U.S. Appl. No. 11/761,313.
Office Action dated May 11, 2009 issued for U.S. Appl. No. 11/761,313.
Final Office Action dated Dec. 10, 2009 for U.S. Appl. No. 11/761,313.
Zetex Semiconductors, Datasheet for ZXD1615, Aug. 2004, Issue 3, pp. 1-12.

* cited by examiner

BOOST CONVERTER WITH INTEGRATED HIGH POWER DISCRETE FET AND LOW VOLTAGE CONTROLLER

CROSS-REFERENCE TO RELATED APPLICATIONS

This application is related to co-pending application Ser. No. 11/761,313, to Allen Chang and Wai-Keung Peter Cheng, entitled "HIGH VOLTAGE AND HIGH POWER BOOST CONVERTER WITH CO-PACKAGED SCHOTTKY DIODE", filed on the same day as the present application, the entire disclosures of which are incorporated herein by reference.

FIELD OF THE INVENTION

This invention generally relates to boost converters and more particularly to high voltage, high power boost converter solutions.

BACKGROUND OF THE INVENTION

Boost converter circuit is used to boost an input voltage to a higher output voltage. A boost ratio of ten or more is possible, e.g., in portable display applications. A boost converter may be used, e.g., to power a string of white LED diode for LCD backlight. In such situations boost converter may be used to convert a five volt input to an output voltage of up to 50V. A boost converter generally includes five basic components, namely a power semiconductor switch, a diode, an inductor, a capacitor and a modulation controller.

Figure 1:
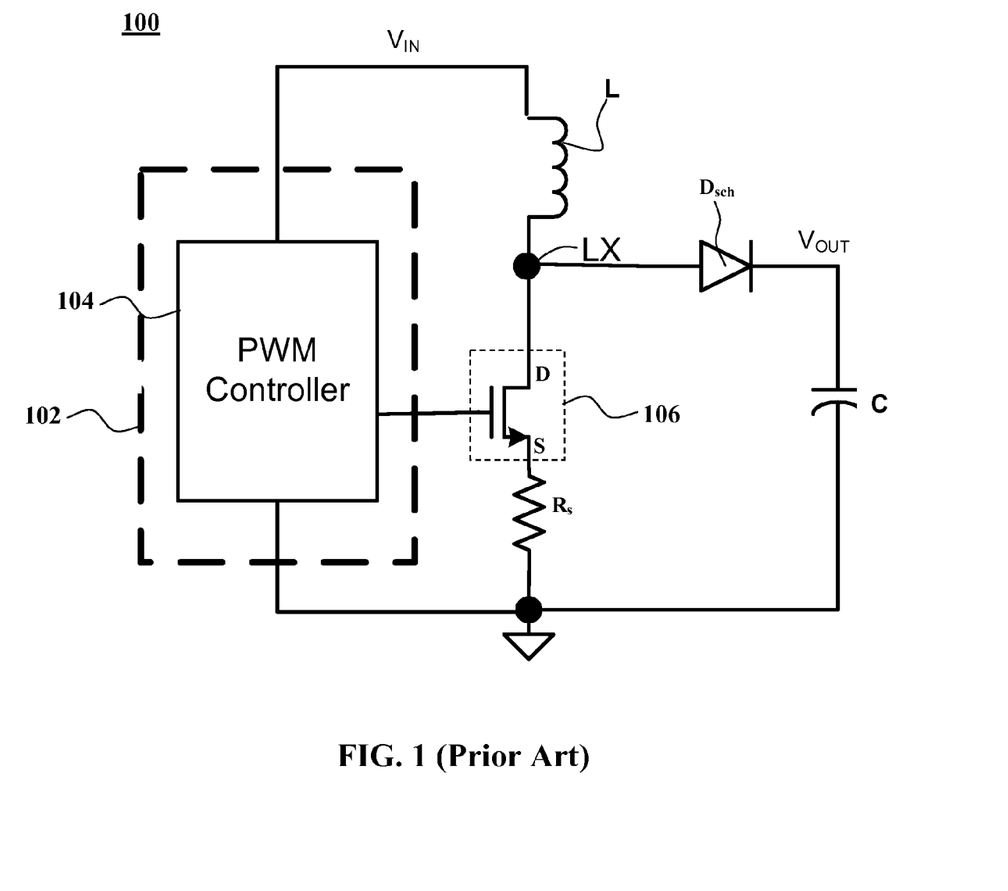
FIG. 1 is a circuit diagram of a boost converter of the Prior Art.

For high power and high output voltage application, a complementary metal-oxide-semiconductor (CMOS) boost controller integrated circuit (IC), an external high voltage N-type field effect transistor (NFET), which provides the necessary blocking voltage, and an external sense resistor are conventionally used as shown in a boost converter 100 of FIG. 1. As shown in FIG. 1, boost converter circuit 100 includes a die pad 102 onto which is mounted a low voltage integrated circuit (IC) containing a controller 104. An external sense resistor $R_s$ and an external high voltage NFET 106 may be coupled to the controller 104. The controller 104 may be any type of modulation controller, such as a pulse-width modulation (PWM) controller. An inductor L may be directly coupled between the input voltage $V_{IN}$ of the controller 104 and a drain D of the NFET 106 at a switch point denoted LX. An external sense resistor $R_s$ may be coupled between a source S of the NFET 106 and ground. An external high voltage (HV) Schottky diode $D_{Sch}$, and a capacitor C may be coupled in series between the drain D and the ground. An output voltage $V_{OUT}$ may be obtained at a point between the Schottky diode $D_{Sch}$, and the capacitor C. There may be a voltage drop $V_{DIODE}$ across the Schottky diode. This type of boost converter circuit 100 may be applied in high voltage, high power applications with low-side or high-side current sense. Such applications may use an external high voltage NFET and an external high power sense resistor at the high side or low side. The external sense resistor may ease the high voltage requirement for the controller IC 104. However, the total size of the low voltage CMOS IC, the external high power resistor and the external high power FET is often larger than is desirable for board space sensitive applications such as portable template DVD players, ultra-compact portable personal computers. In addition, the external sense resistor and the external high power FET increase the total Bill of Material (BOM) Cost.

Figure 2:
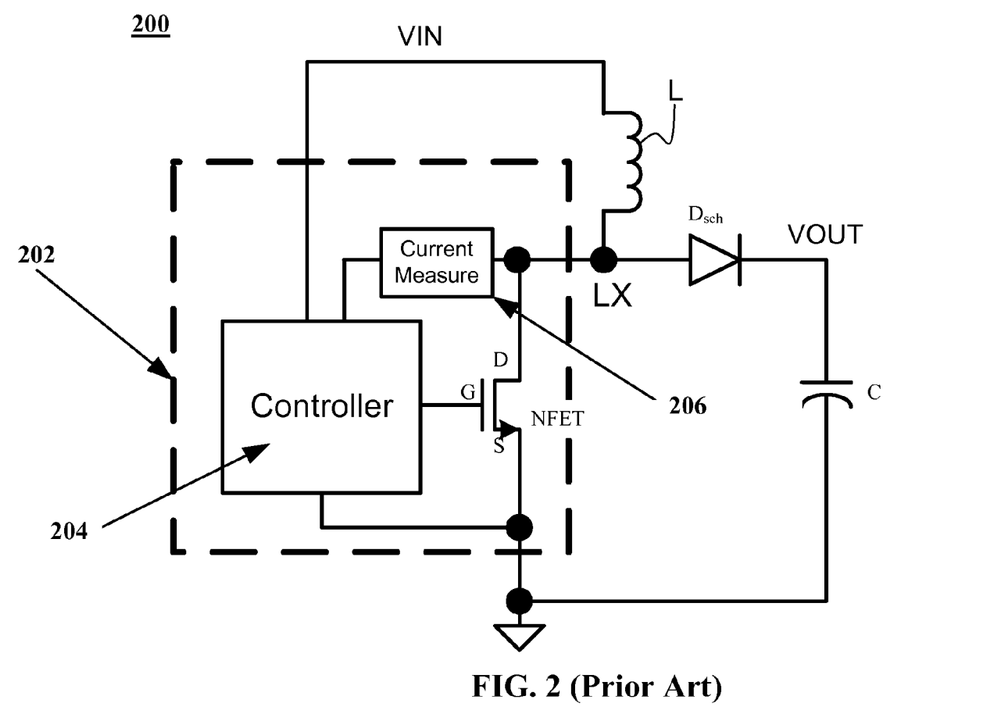
FIG. 2 is a circuit diagram of another boost converter of Prior Art.

For low power but high output voltage applications, a fully integrated boost converter with CMOS or Bipolar Controller and DMOS or Bipolar boost switch is sometimes used, e.g., as shown in FIG. 2. Similar to boost converter circuit 100 as described above, a boost converter 200 may include an inductor L directly coupled to the input voltage $V_{IN}$ and coupled to an output voltage $V_{OUT}$ through an external high voltage (HV) Schottky diode $D_{Sch}$ and a capacitor C provides smoothing of the output voltage $V_{OUT}$. The boost converter 200 may also include a low voltage controller 204, a high voltage NFET and a high voltage current sense resistor 206, all of which are built on a multi-voltage IC 202, which must be high voltage-rated.

For low power but high output voltage applications, a fully integrated Boost Converter may achieve a small form factor. However, the production cost may be too high due to the custom nature of the high voltage IC processes, which require a maximum voltage rating (Vout+Vdiode) dictated by process limitations.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

According to embodiments of the invention, a low voltage controller may be co-packaged with a high-voltage vertical discrete FET in a high-voltage output booster configuration in a single package.

Figure 3:
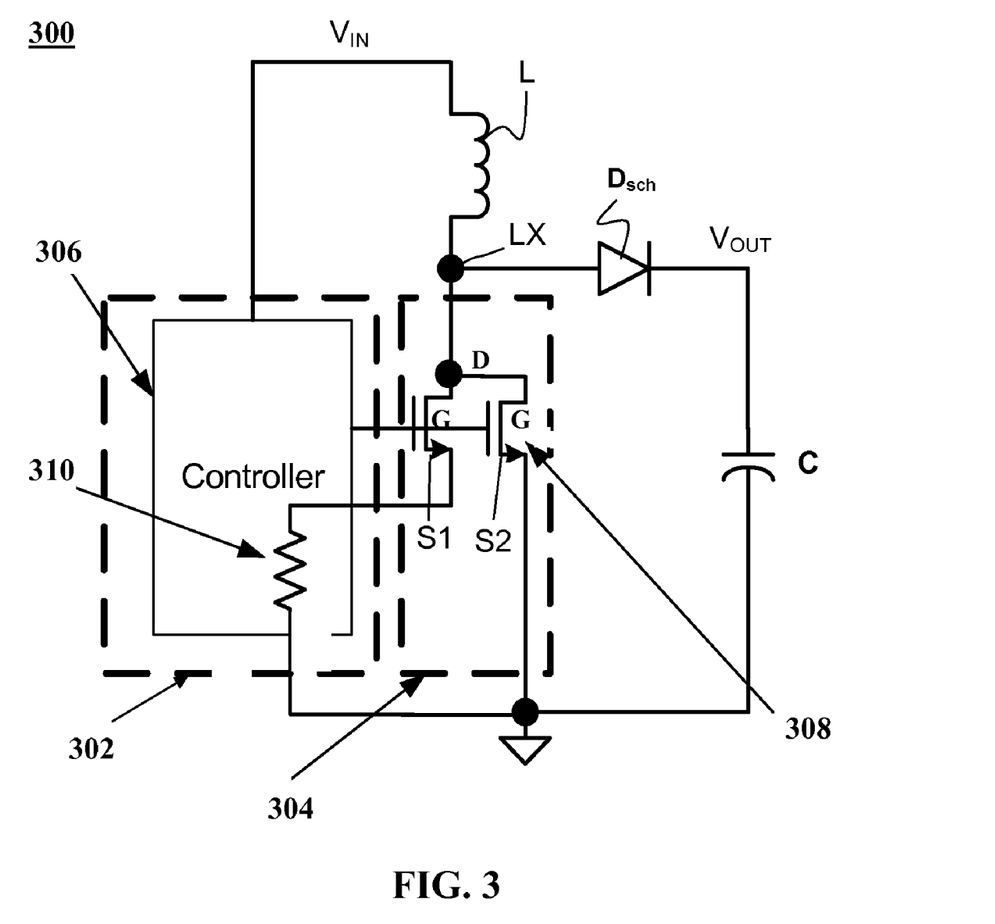
FIG. 3 is a circuit diagram of a boost converter according to a first embodiment of the present invention.

FIG. 3 is a circuit diagram illustrating a boost converter 300 according to an embodiment of the present invention. As shown in FIG. 3, boost converter 300 includes low voltage controller 306 having an internal current sense device 310 is built on a first die pad 302. The sense device 310 may be a resistor or a transistor, e.g., a FET such as a metal-oxide-semiconductor field effect transistor (MOSFET)). By way of example, the controller 306 may be a pulse width modulation (PWM) controller, such as a model MAX1771 step-up DC-DC controller from Maxim Integrated Products of Sunnyvale, Calif. Alternatively, the controller 306 may be any other type of modulation controller, such as a pulse frequency modulation controller. The controller 306 may be manufactured using a low voltage CMOS process with a rating up to an input voltage $V_{IN}$ only, which may provide better performance, lower power consumption, and lower die cost due to efficient layout. Specifically, due to a higher breakdown requirement for high voltage CMOS processes, the lateral spacing of devices and minimum geometry of the devices is much higher than for a low voltage CMOS process. A high voltage dual source vertical discrete FET 308 having sources S1, S2, a drain D and a gate G is built on a second die pad 304 is used for an output switch. One source S1 (used for sensing) may be coupled to ground through the internal current sense device 310. The other source S2 (used for power) may be coupled directly to ground. Examples of vertical FETs and method of fabricating vertical FETs are described, e.g., is U.S. Pat. Nos. 5,126,807, 5,242,845, 5,260,227, 5,578,508 and 6,621,121, all of which are incorporated herein by reference.

The FET may be characterized by a device size ratio of 1:N. Typically, each device S1, S2 is made up of a number of cells in parallel. The 1:N size ratio may be determined from the ratio of the number of cells in one source S1 to the number of cells in the other source S2. The size ratio may be approximately equivalent to the ratio of current through the two devices S1 and S2. The value of N in the ratio will determine the efficiency of the system and tracking linearity for the sense source S1. If N is small, tracking linearity tends to be good but the system tends to be less efficient because more current is being drawn for the sense device S1. If N is large, the efficiency tends to be good but tracking linearity tends to be reduced because the device mismatch between the sense source S1 and power source S2 is too large. For low power operation, (e.g., less than about 1 amp) N typically ranges from about 300 to about 1000. For high power (e.g., more than about 1 amp), N is typically between about 1000 and about 3000.

Preferably, the high voltage discrete FET 308 has a bottom Drain D. Commercially available discrete FETs are typically bottom drain FETS. The discrete FET 308 can provide a much higher voltage rating without the penalty of die size and ON resistance. Current sensing for either modulation control or discrete FET protection may be accomplished by a Dual Source pad layout for the Discrete FET 308, and therefore. In such a configuration, no additional high voltage device is required for current sensing. An external inductor L may be directly coupled between the input voltage $V_{IN}$ and drain D of the discrete FET 308. An external high voltage (HV) Schottky diode $D_{Sch}$, and a capacitor C may be coupled in series between the inductor L and ground at a switch point LX. An output voltage $V_{OUT}$ may be obtained at a point between the Schottky diode $D_{Sch}$ and the capacitor C. There may be a voltage drop $V_{DIODE}$ across the Schottky diode $D_{Sch}$. The HV dual source, vertical discrete FET 308 may have a drain to source voltage ($V_{DS}$) rating up to ($V_{OUT}+V_{DIODE}$) and gate to source voltage ($V_{GS}$) rating up to $V_{IN}$.

The controller 306 and discrete FET 308 may be co-packaged on a split die pad within a single package to provide a high-voltage, high-power solution in a compact form factor.

Figure 4:
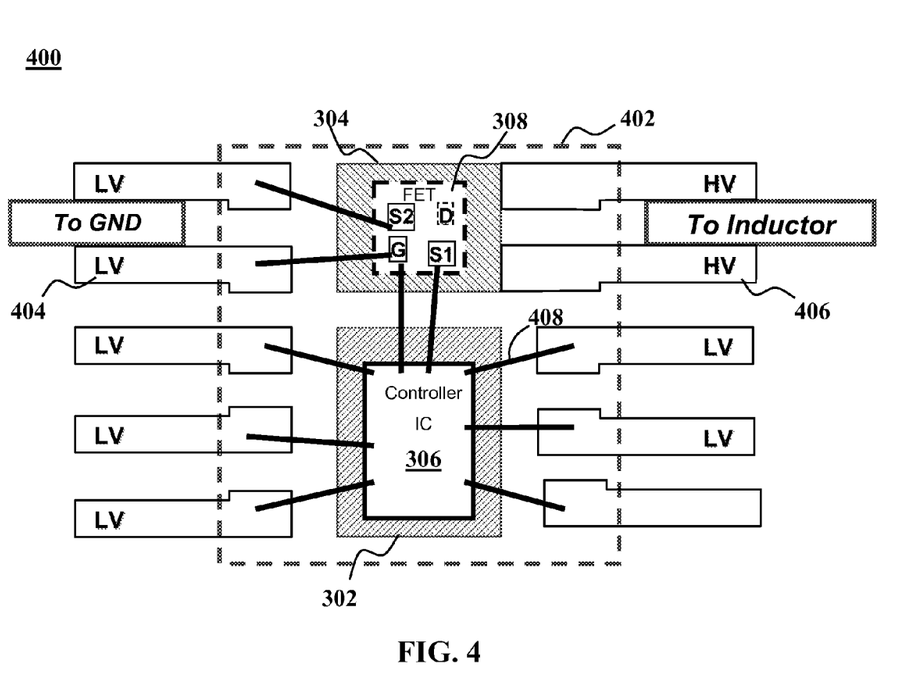
FIG. 4 is a top view of a boost IC package assembly of the boost converter of FIG. 8.

By way of example, FIG. 4 is a top view of a boost IC package assembly 400 of the boost converter 300 as described in FIG. 3. As shown in FIG. 4, the low voltage controller 306 may be attached to the first die pad 302 with a layer of either conductive epoxy or insulating epoxy deposited between the modulation controller 306 and the first die pad 302. The dual source, discrete FET 308 may be attached on the second die pad 304 with a conductive epoxy layer deposited between the discrete FET 308 and the second pad 304. The controller 306, the discrete FET 308 may be electrically connected to each other and to leads 404, which are connected to the ground, and to leads 406, which are connected to the inductor, through the bond wires 408. The controller 306, discrete FET 308 and bond wires 408 may be packaged in a plastic package 402.

Figure 5A:
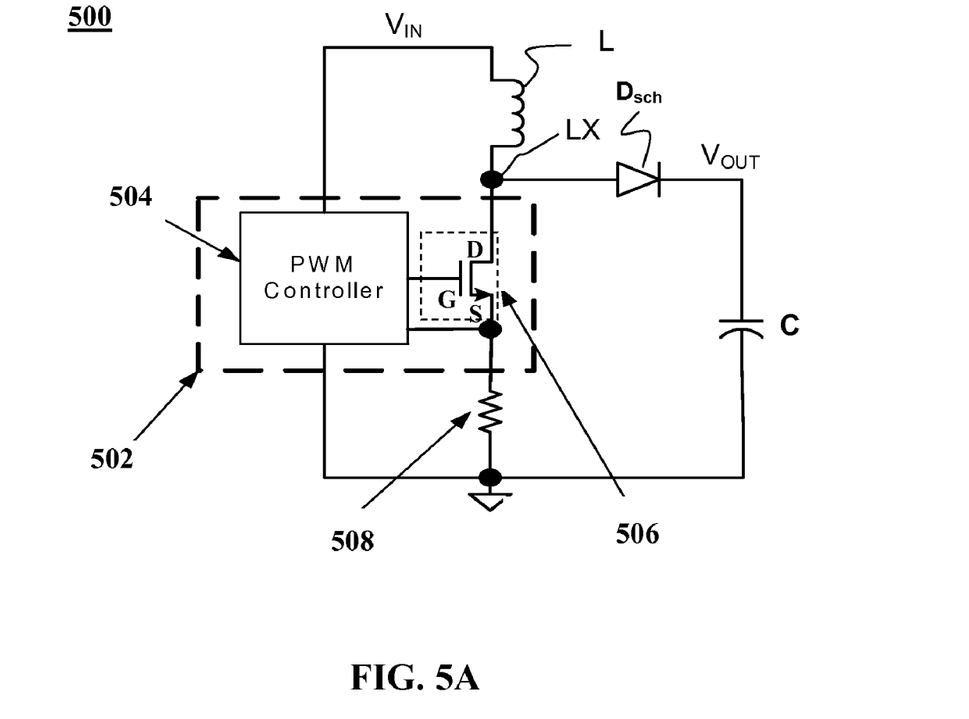
FIGS. 5A-5C are circuit diagrams illustrating the boost converters having the external sense resistors located either at low-side or high-side of the boost converter according to a second embodiment of the present invention.

In alternative embodiments, a low voltage process may be used to fabricate a controller and a high voltage discrete FET with a bottom source may be used for the output switch. Examples of the structure and manufacture of bottom source FETs are described, e.g., in commonly-assigned U.S. patent application Ser. Nos. 11/500,810 and 11/522,669 both of which are incorporated herein by reference. FIG. 5A is a circuit diagram of boost converter 500 according to an embodiment of the present invention. The boost converter 500 includes a low voltage controller 504 (e.g., a PWM controller) and a bottom source, high voltage vertical discrete FET 506 having a bottom source S, gate G and drain D. By way of example, the controller 504 may be a PWM controller. Both the controller 504 and the discrete FET 506 may be built on a single die pad 502. The boost converter 500 may also include an external current sense device 508 (e.g., a resistor or transistor, such as a MOSFET) located at a low side of the controller 504 between the source S and ground. The external current sense device 508 may be characterized by a resistance $R_s$. An external inductor L may be directly coupled between the input voltage $V_{IN}$ and drain D of the discrete FET 506. An external high voltage (HV) Schottky diode $D_{Sch}$, and a capacitor C may be coupled in series between the inductor L and ground. There may be a voltage drop $V_{DIODE}$ across the Schottky diode $D_{Sch}$. An output voltage $V_{OUT}$ may be obtained at a point between the Schottky diode $D_{Sch}$ and the capacitor C. The bottom source, high voltage vertical discrete FET 506 may have a drain to source voltage ($V_{DS}$) rated to ($V_{OUT}+V_{DIODE}$) and a low voltage gate to source voltage $V_{GS}$ rated up to $V_{IN}$.

Figure 5B:
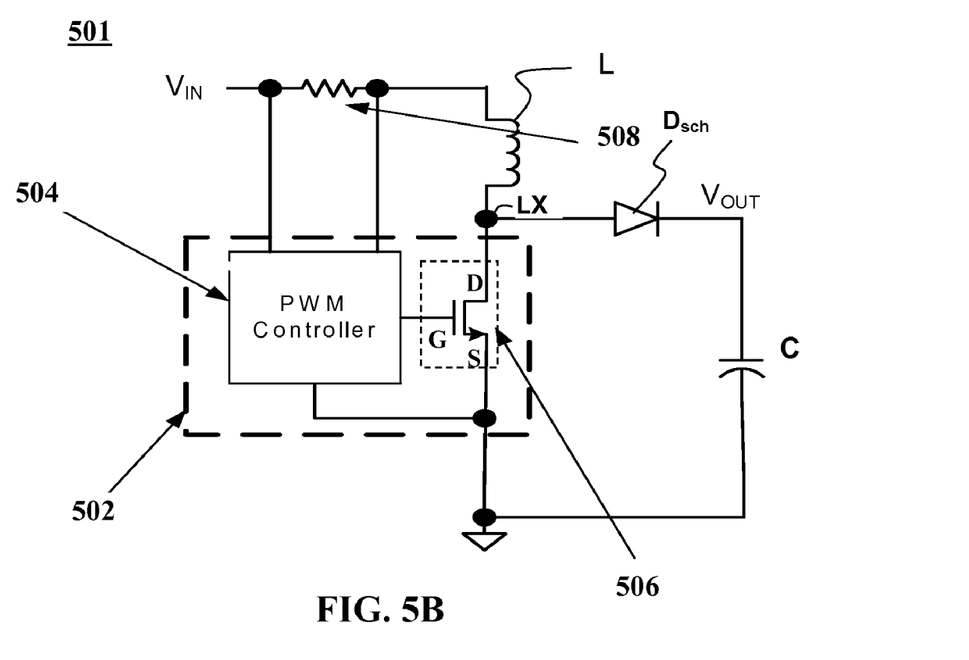

FIG. 5B is a circuit diagram of an alternative boost converter 501 with the external current sense device 508 located at the high-side of the controller 504. In this case the sense resistor 508 may be coupled between $V_{IN}$ and an inductor L. An external inductor L may be coupled between the external resistor 508 and the drain D. The source S may be coupled directly to ground. An external high voltage (HV) Schottky diode $D_{Sch}$, and a capacitor C may be coupled in series between the inductor L and ground at a switch point LX. An output voltage $V_{OUT}$ may be obtained at a point between the Schottky diode $D_{Sch}$ and the capacitor C.

Figure 5C:
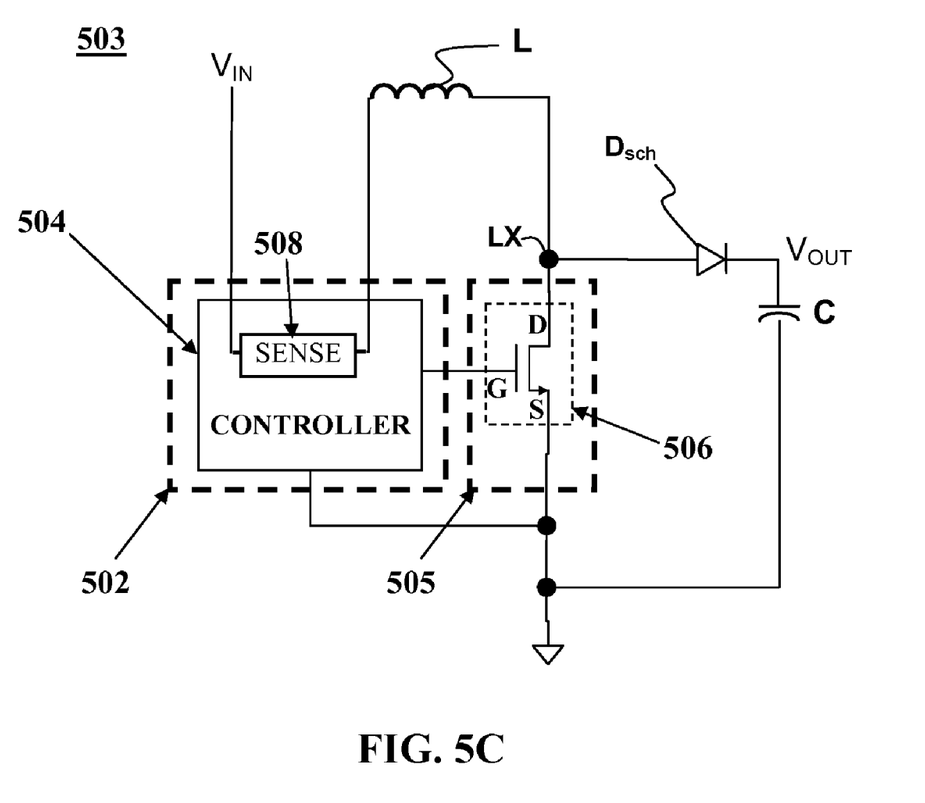

FIG. 5C is a circuit diagram of an alternative boost converter 503 that uses a split die pad. Specifically, the controller 504 may be mounted to a first die pad 502 and the high voltage vertical discrete FET 506 may be mounted to a second die pad 505. In this example, the controller 504 includes an internal current sense device 508 located at the high-side of the controller 504. By way of example, the internal current sense device 508 may be a resistor or a transistor, e.g., a FET such as a metal-oxide-semiconductor field effect transistor (MOSFET). The internal sense device 508 may be coupled between $V_{IN}$ and an external inductor L. The inductor L may be coupled to an external high voltage (HV) Schottky diode $D_{Sch}$, at a switch point LX. A capacitor C may be coupled in series between the Schottky diode $D_{Sch}$ and ground. An output voltage $V_{OUT}$ may be obtained at a point between the Schottky diode $D_{Sch}$ and the capacitor C.

Figure 6A:
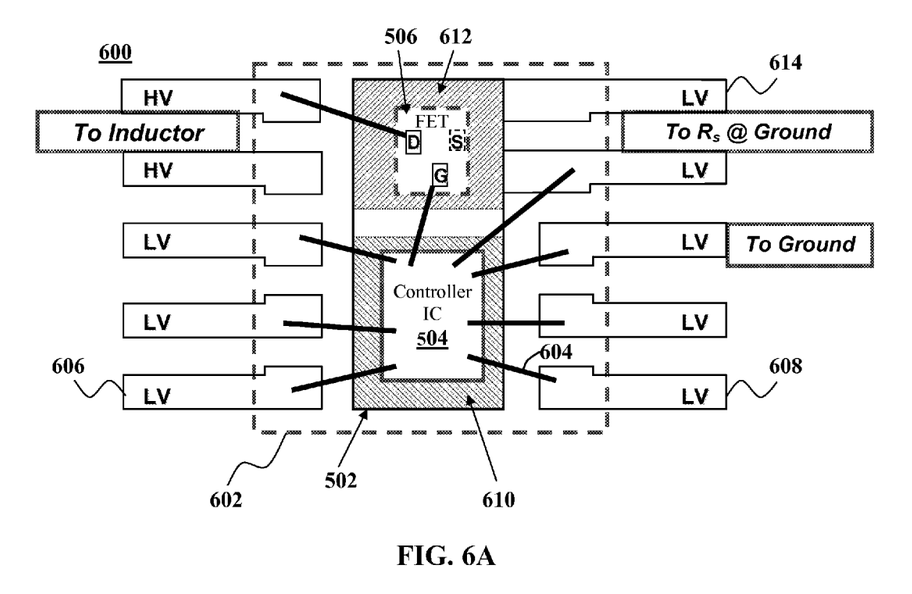
FIGS. 6A-6B are top views of boost IC package assemblies of the boost converters of FIGS. 5A and 5B.

In the configurations shown in FIG. 5A or FIG. 5B, the controller 504 may be co-packaged with the vertical discrete FET 506 on a single die pad. For example, FIG. 6A is a top view of a boost IC package assembly 600 containing the boost converter 500. As shown in FIG. 6A, the discrete FET 506 and the controller 504 may be attached on a single die pad 502 with an insulating epoxy layer 610 deposited between the controller 504 and the die pad 502 and a conductive epoxy layer 612 deposited between the discrete FET 506 and the single die pad 502. The insulating epoxy layer 610 is required to stand off a DC voltage differential equivalent to the drop across the external current sense device 508. The controller 504 and the discrete FET 506 may be electrically connected to each other and to the leads 606 and 608 through the bond wires 604. The discrete FET 506 may be electrically connected to the inductor L through the bond wires 604, and directly electrically connected to the external current sense device 508 at ground through leads 614. The controller 504 is electrically connected to the ground through leads 608. The controller 504 and the discrete FET 506, which are attached to a single die pad 502, may be packaged in a plastic package 602.

Figure 6B:
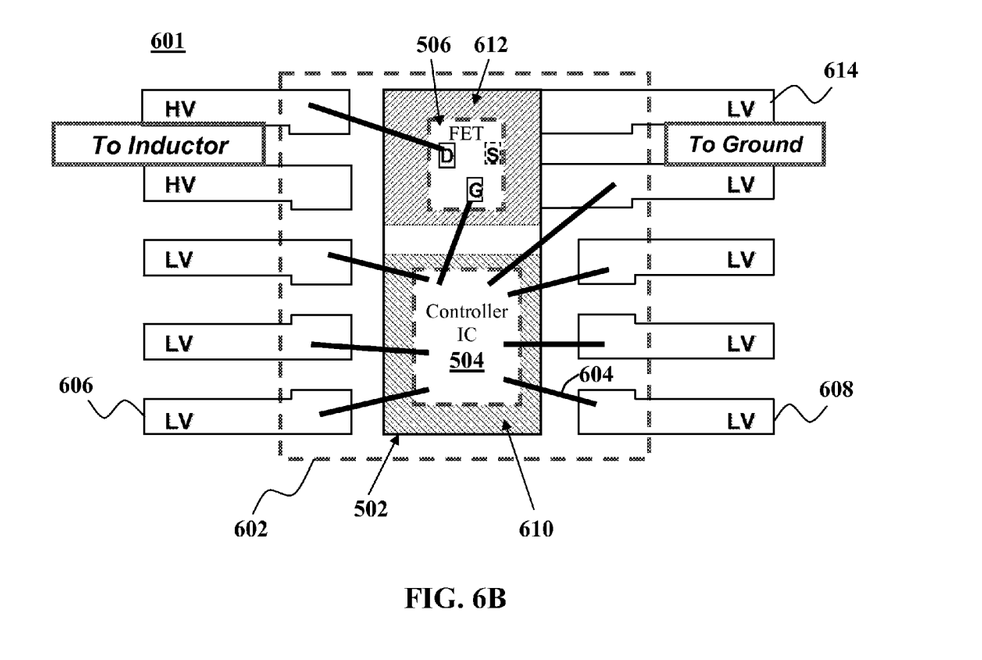

FIG. 6B is a top view of a boost IC package assembly 601 containing the boost converter 501. The structure of the IC package assembly 601 is similar to the IC package assembly 600, except the discrete FET 506 is electrically connected to the ground through leads 614 and the controller 504 is electrically connected to the external current sense device 508 at VIN through the leads 608. In this case, the insulating epoxy layer 610 has no stand off requirement since voltage differential is zero, which improves reliability of the boost converter.

The controller 504 may be manufactured using Low Voltage CMOS process, which provides better performance, lower power consumption, and lower die cost due to efficient layout. The High Voltage Discrete FET 506 with bottom Source S may be used for the output switch, which provides a much higher voltage rating without the penalty of die size and ON resistance. Overall size of the boost converter 500 and 501 may be made compact for High Voltage and High Power applications.

Figure 7:
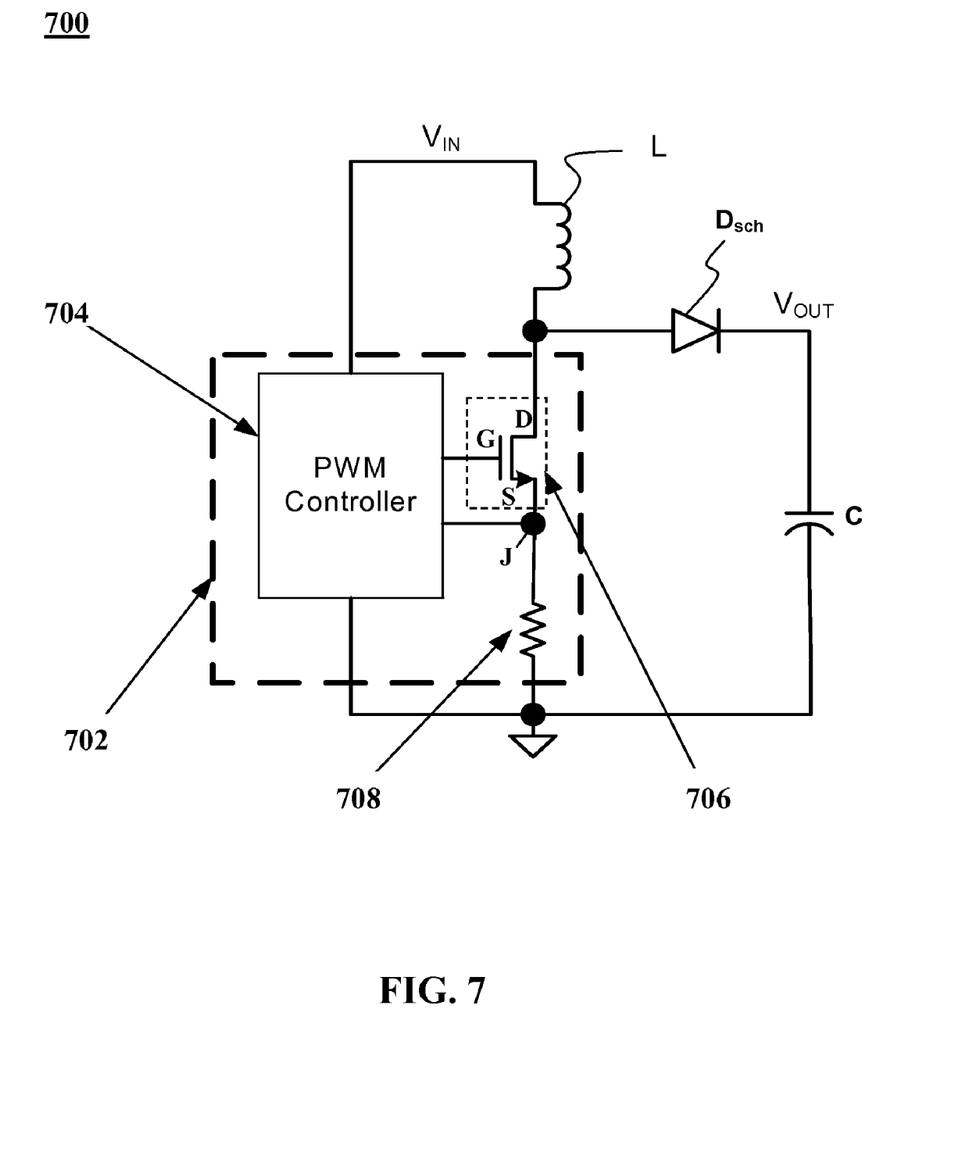
FIG. 7 is a circuit diagram of a boost converter according to a third embodiment of the present invention.

FIG. 7 is a circuit diagram of a boost converter 700 according to another embodiment of the present invention. As shown in FIG. 7, the boost converter 700 may include a low voltage controller 704 (e.g., a PWM controller), a bottom source, high voltage discrete FET 706 and a discrete current sense device 708 (e.g., a resistor or transistor), all of which are built on a single die pad 702. The controller 704 may be manufactured using a low voltage CMOS process, which may provide better performance, lower power consumption, and lower die cost due to efficient layout. The discrete FET 706 has a bottom source S, gate G and drain D. The High Voltage Discrete FET 706 with bottom Source may be used for the output switch, which provides a much higher voltage rating without the penalty of die size and ON resistance. The discrete current sense device 708 may be used to sense the current at the low-side of the boost converter 700 between the bottom source S and ground. By way of example, the discrete sense device 708 may be a vertical current flow resistor. As used herein "vertical current flow" means that the resistor is designed so that current flows more or less perpendicular to a plane of a substrate on which the resistor is formed as opposed to flowing along the plane. The bottom source S and sense resistor 708 are electrically connected at a junction J.

An external inductor L may be directly coupled between the input voltage VIN and drain D of the discrete FET 706. An external high voltage (HV) Schottky diode $D_{Sch}$, and a capacitor C may be coupled in series between the inductor L and ground at a switch point LX. There may be a voltage drop $V_{DIODE}$ across the Schottky diode $D_{Sch}$. An output voltage $V_{OUT}$ may be obtained at a point between the Schottky diode $D_{Sch}$ and the capacitor C. The discrete FET 706 may have a drain to source voltage (VDS) rated to ($V_{OUT}$+$V_{DIODE}$) and a gate to source voltage (VGS) rated up to $V_{IN}$.

Figure 8:
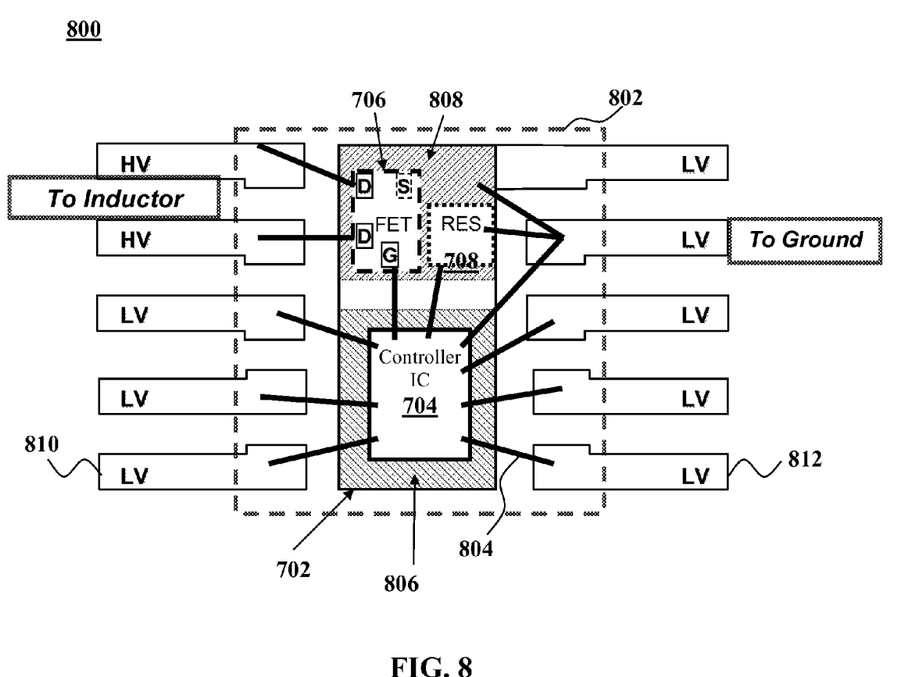
FIG. 8 is a top view of a boost IC package assembly of the boost converter of FIG. 12.

The overall size of the boost converter 700 may be made compact for High Voltage and High Power application. For example, FIG. 8 is a top view of a boost IC package assembly 800 of the boost converter 700. As shown in FIG. 8, the controller 704, the discrete FET 706 and the discrete sense device 708 may be located on a single die pad 702. The controller 704 may be attached to a part of the single die pad 702 with an insulating epoxy layer 806 deposited between the controller 704 and the single die pad 702. The discrete FET 706 and the discrete sense device 708 are attached to a different part of the single die pad 702 with one or more conductive epoxy layers 808 deposited between the discrete FET 704 and the single die pad 702 and between the discrete sense resistor 708 and the single die pad 702. The conductive epoxy layer 808 may provide connections to the bottom source of the discrete FET 704 and the discrete sense device 708 at the junction J indicated schematically in FIG. 7. Preferably, the insulating epoxy layer 806 is sufficiently thick and/or insulative to be able to stand off a DC voltage differential equivalent to the drop across the sense resistor 708. The controller 704, the discrete FET 706, and the discrete sense resistor 708 may be electrically connected to each other and to the leads 810 and 812 through the bond wires 804. The controller 704, the discrete FET 706, the discrete sense device 708, which are attached on the single die pad 702, may be co-packaged in a plastic package 802.

Figure 9:
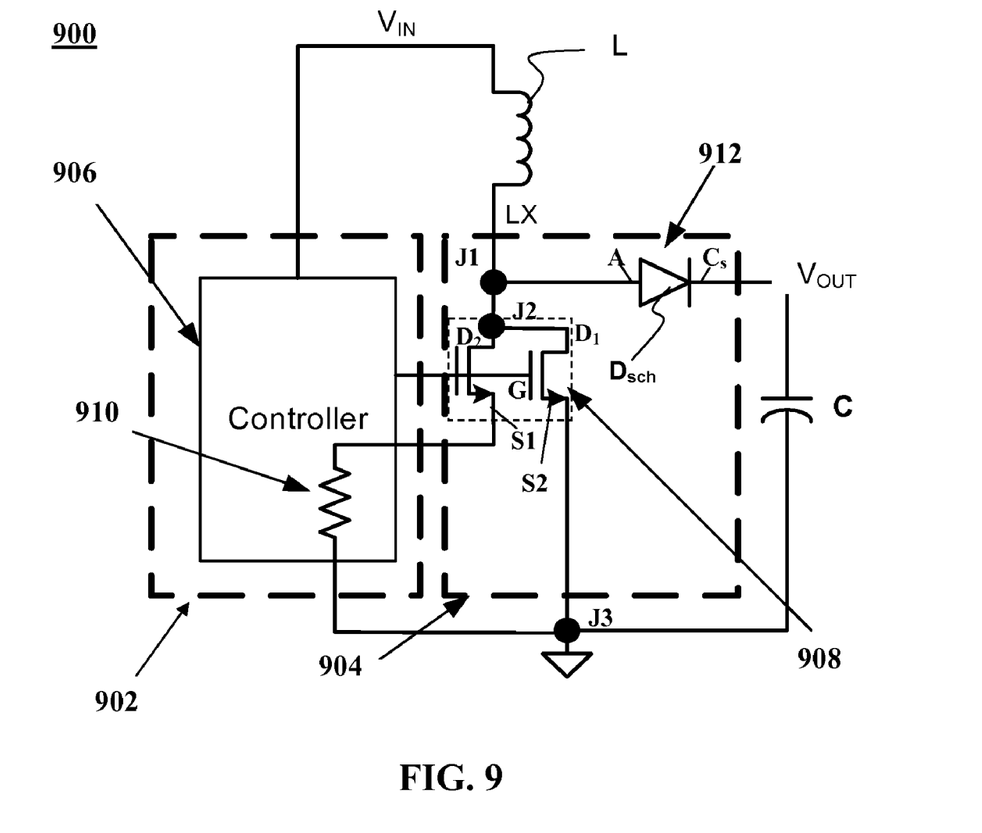
FIG. 9 is a circuit diagram of a boost converter according to a fourth embodiment of the present invention.

FIG. 9 is a circuit diagram of a boost converter 900 of an embodiment of the present invention. As shown in FIG. 9, the boost converter 900 may include first and second die pads 902 and 904. A controller 906 and an internal sense device 910 (e.g., a resistor or transistor) may be built on the first die pad 902. The controller 906 may be manufactured a Using Low Voltage CMOS process, which can provide better performance, lower power consumption, and lower die cost due to efficient layout. A high voltage dual source, discrete FET 908 with gates G, sources S1, S2 and bottom drains D1, D2 and a Bottom Anode Schottky Diode (BA-SD) 912 may be built on the second die pad 904. The High Voltage Discrete FET 908, which may be used as an output switch, provides a much higher voltage rating without the penalty of die size and ON resistance. An inductor L may be connected between an input voltage pin VIN of the controller 906 and a junction J1. An anode A of the BA-SD 912 may also be connected to the junction J1. The drains D1, D2 may be coupled together at a junction J2. Junctions J1 and J2 may be electrically connected to each other. The internal sense resistor 910 may be used to sense the current at the low-side of the controller 906 between a first bottom source S1 and a third junction J3, which may be connected to ground. The second bottom source S2 may be coupled directly to the third junction J3. A capacitor C may be coupled between a cathode $C_s$ of the Schottky diode 912 and the third junction J3. There may be a voltage drop $V_{DIODE}$ across the Schottky diode $D_{Sch}$. The discrete FET 908 may have a drain to source voltage ($V_{DS}$) rating up to ($V_{OUT}$+$V_{DIODE}$) and gain to source voltage ($V_{GS}$) rating up to $V_{IN}$.

Figure 10:
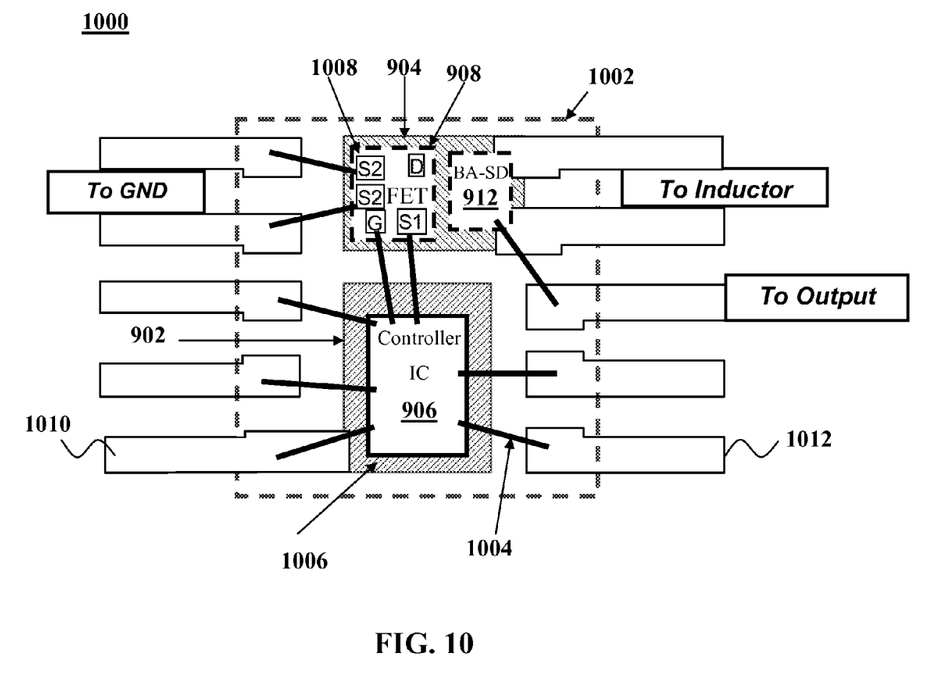
FIG. 10 is a top view of a boost IC package assembly of the boost converter of FIG. 9.

FIG. 10 is a top view illustrating a boost IC package assembly 1000 of the boost converter 900. As shown in FIG. 10, the controller 906 with the internal sense device 910 may be attached on the first die pad 902 by a conductive or insulating epoxy layer 1006 deposited between the controller 906 and the first die pad 902. The discrete FET 908 and the BA-SD 912 may be attached to the second die pad 904 by a conductive epoxy layer 1008 deposited between the discrete FET 908 and the BA-SD 912. The anode A of the BA-SD 912 and the drains D1, D2 may make electrical contact to the second die pad 902 via the conductive epoxy layer 1008, thereby providing the equivalent of junctions J1, J2. The controller 906, the discrete FET 908, the BA-SD 912 may be electrically connected together or to the leads 1010, 1012 through bond wires 1004. The controller 906 with internal sense resistor 910, the discrete FET 908, the BA-SD 912, which are attached on the first and second pad 902, 904, are co-packaged on a plastic package 1002.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A boost converter, comprising:
    a low voltage controller integrated circuit (IC) mounted to a first die pad;
    an external high voltage, vertical, discrete field effect transistor (FET) mounted to a second die pad, the external high voltage vertical discrete FET having a gate coupled to the low voltage controller IC and a bottom drain facing and in electrical contact with the second die pad; and
    an external high voltage Schottky diode mounted to the second die pad, the external high voltage Schottky diode having an anode facing and in electrical contact with the second die pad, whereby the anode of the Schottky diode is coupled to a drain of the high voltage, vertical, discrete FET through the second die pad;
    wherein the IC, FET, and Schottky diode are formed on separate semiconductor chips;
    wherein the low voltage controller IC and the external high voltage vertical discrete FET are configured as part of a boost converter circuit that boosts an input voltage to a higher output voltage,
    wherein the first and second die pads are separate die pads that are electrically isolated from each other and are packaged together side by side in a single package.

2. The boost converter of claim 1, wherein the low voltage controller integrated circuit includes a pulse-wide modulation (PWM) controller.

3. The boost converter of claim 1, wherein the low voltage controller IC includes an internal sense device.

4. The boost converter of claim 3, wherein the internal sense device includes a resistor or transistor.

5. The boost converter of claim 4 wherein the internal sense device includes a field effect transistor.

6. The boost converter of claim 1 wherein the high voltage, vertical, discrete field effect transistor is attached to the second die pad using a conductive epoxy.

7. The boost converter of claim 6, wherein the low voltage controller IC includes an internal current sense device.

8. The boost converter of claim 7 wherein the internal current sense device includes a resistor or transistor.

9. The boost converter of claim 7 wherein the internal current sense device includes a field effect transistor.

10. The boost converter of claim 1, wherein the bottom-anode Schottky diode is attached to the second die pad using a conductive epoxy between the bottom anode and the second die pad.

11. The boost converter of claim 1 further comprising an external high voltage Schottky diode having an anode coupled to a drain of the high voltage, vertical, discrete FET.

12. The boost converter of claim 1 wherein the low voltage controller integrated circuit and the high voltage, vertical, discrete field effect transistor are attached to a single die pad.

13. The boost converter of claim 12, wherein the low voltage controller integrated circuit is attached on the single die pad using insulating epoxy.

14. The boost converter of claim 13, wherein high voltage, vertical, discrete field effect transistor is attached to the single die pad using conductive epoxy.

15. The boost converter of claim 12 further comprising a discrete current sense device, wherein the discrete sense device is also packed in the single die pad.

16. The boost converter of claim 15 wherein the discrete current sense device is a discrete current sense resistor.

17. The boost converter of claim 16 wherein the discrete current sense resistor is a vertical sense resistor attached to the single die pad using conductive epoxy.

18. The boost converter of claim 12 further comprising an external current sense device.

19. The boost converter of claim 18 wherein the external current sense device is an external current sense resistor.

20. The boost converter of claim 19 wherein the external current sense resistor is connected at a low-voltage side of the controller IC.

21. The boost converter of claim 19, wherein the external sense resistor is connected at a high-voltage side of the controller IC.

22. The boost converter of claim 12, wherein the high voltage, vertical, discrete field effect transistor is a bottom source discrete FET having a bottom source in electrical contact with the single die pad.

23. The boost converter of claim 6, wherein the high voltage, vertical, discrete field effect transistor is a bottom source discrete FET having a bottom source in electrical contact with the second die pad.

24. The boost converter of claim 7, wherein the high voltage, vertical, discrete field effect transistor is a bottom drain discrete FET having two separate top sources, wherein at least one of the sources is in electrical contact to the internal current sense device.

* * * * *